United States Patent [19]

Theriault

[11] 4,399,559

[45] Aug. 16, 1983

[54] VOLTAGE CONTROLLED TUNER WITH VOLTAGE VARIABLE FREQUENCY SELECTIVE ARRANGEMENTS CONTROLLED IN RESPONSE TO A CONTROL VOLTAGE GENERATED INDEPENDENTLY OF THE TUNING VOLTAGE

[75] Inventor: Gerald E. Theriault, Hopewell, N.J.

[73] Assignee: RCA Corporation, New York, N.Y.

[21] Appl. No.: 309,696

[22] Filed: Oct. 8, 1981

Related U.S. Application Data

[62] Division of Ser. No. 154,834, May 30, 1980, Pat. No. 4,361,909.

[51] Int. Cl.³ .............................................. H04B 1/16
[52] U.S. Cl. .................................... 455/179; 455/182; 334/15
[58] Field of Search ............... 455/179, 182, 185, 186, 455/187, 192, 169, 286; 334/15, 16, 56; 358/191.1, 193.1, 195.1

[56] References Cited

U.S. PATENT DOCUMENTS

| | | | |
|---|---|---|---|
| 3,517,352 | 6/1970 | Marshall et al. | 334/15 |
| 3,550,010 | 12/1970 | Byers | 455/286 |
| 3,696,302 | 10/1972 | Gossard | 455/189 |
| 3,845,393 | 10/1974 | Basset | 455/182 |
| 3,852,670 | 12/1974 | Ma | 455/195 |
| 4,023,106 | 5/1977 | Utsunomiya | 455/179 |
| 4,081,771 | 3/1978 | Hendrickson | 455/182 |
| 4,153,887 | 8/1979 | Poppa | 334/56 |
| 4,291,290 | 9/1981 | Ijichi | 334/15 |

Primary Examiner—Tommy P. Chin
Attorney, Agent, or Firm—E. M. Whitacre; P. J. Rasmussen; P. M. Emanuel

[57] ABSTRACT

In a television receiver, two tunable traps are incorporated between the RF input and the tuner to attenuate undesired signals symmetrically located in frequency below and above respective desired RF carriers. The tunable traps are responsive to a control voltage generated independently of the tuning voltage for controlling the tuned circuits of the tuner so that the attenuation frequencies of the traps can be moved with respect to the respective frequencies of desired RF carriers to optimize interference reduction.

3 Claims, 8 Drawing Figures

4,399,559

VOLTAGE CONTROLLED TUNER WITH VOLTAGE VARIABLE FREQUENCY SELECTIVE ARRANGEMENTS CONTROLLED IN RESPONSE TO A CONTROL VOLTAGE GENERATED INDEPENDENTLY OF THE TUNING VOLTAGE

This is a division of application Ser. No. 154,834, filed May 30, 1980, now U.S. Pat. No. 4,361,909.

ENVIRONMENT OF THE INVENTION

The present invention relates to voltage variable frequency selective arrangements for voltage controlled radio and television tuners which are controlled in response to a control voltage which is generated independently of the tuning voltage.

BACKGROUND OF THE INVENTION

It is known to include signal rejection filters prior to the RF tuner of a television receiver to inhibit undesired signals from reaching the tuner and therefore interfering with the proper reception of desired signals. For example, highly selective rejection filters or traps have been provided to the tuner of a television to reject FM signals. For the most part, the traps that have been employed have been fixed-tuned, i.e., have employed capacitors and inductors which have fixed values, to reject a specific undesired signal. It is also known to employ both mechanical and electrical switching arrangements to switch the fixed elements of the traps in accordance with the band of desired signal. Such prior pre-tuner trap arrangements have not been adjustable as a function of the channel selected and therefore have been unable to effectively reject undesired variable frequency signals specifically associated with each individual channel.

It is also known to provide tunable traps between the RF input and tuner of a television receiver to attenuate specific variable frequency signals offset in frequency by a predetermined amount from the desired frequency tuned in accordance with the selected channel. For example, U.S. Pat. No. 3,696,302, entitled "UHF-VHF Varactor Tuner Amplifying Band Converter", issued in the name of Gossard on Oct. 3, 1972, discloses a double conversion tuner, i.e., one with two successive heterodyning stages, in which a tunable trap for inhibiting the first local oscillator signal from reaching the RF input is located prior to the tuner in each of a UHF and VHF section. In addition, a tunable trap for inhibiting an RF image signal (i.e., a RF signal having a frequency equal to the sum of the local oscillator frequency and the IF frequency) from reaching the tuner is commonly located prior to the tuner in the VHF section. The versatility of such traps is limited because the trap frequency closely tracks the RF carrier frequency.

SUMMARY OF THE INVENTION

In accordance with the present invention, in a voltage controlled tuner including an RF section and local oscillator responsive to a tuning control for heterodyning a selected RF carrier to produce an IF signal and an IF section for processing the IF signal, a further frequency selective circuit, e.g., such as a trap, is provided for controlling the frequency selectively of the tuner in response to a further control voltage which is generated independently of the tuning control voltage but also in response to the selection of channels.

BRIEF DESCRIPTION OF THE DRAWING

These and other aspects of the present invention may best be understood by reference to the accompanying Drawing in which.

DETAILED DESCRIPTION OF THE DRAWING

Figure 1:
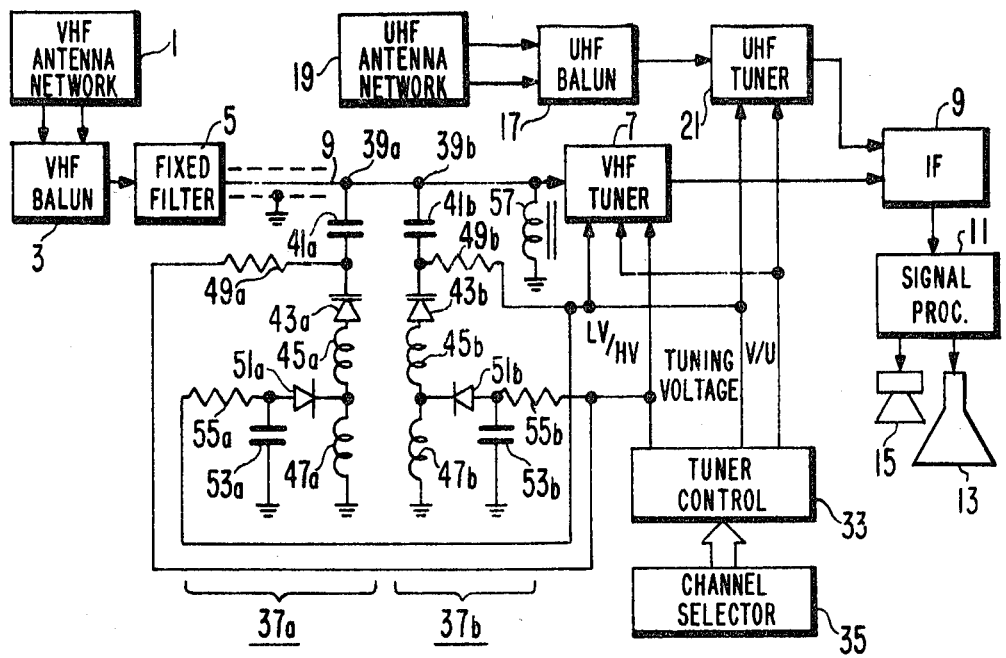
FIGS. 1, 1A, 3, 5 and 7 are schematics, partly in block form, of various voltage controlled tuning arrangements for a television receiver employing voltage variable traps. In connection with the present invention, the arrangement of FIG. 5 is of particular interest since it includes apparatus for generating a control voltage for voltage variable traps independently of the tuning voltage.

Referring now to FIG. 1, a balanced VHF antenna network 1 comprising, for example, a VHF antenna and conventional twin lead antenna connection cable with a characteristic impedance typically of 300 ohms, provides broadcast RF carriers in the low VHF and high VHF bands. A VHF balun 3 converts the balanced impedance configuration of antenna network 1 to an unbalanced impedance configuration having a characteristic impedance typically of, e.g., 75 ohms. The output signal of balun 3 is filtered by fixed frequency input filter 5 arranged to attenuate undesired fixed-frequency signals, e.g., in the FM and citizens band (CB) frequency ranges, which may otherwise produce interference. The filtered RF carriers are applied to a VHF tuner 7 through a conductor 9 which may, in part, comprise the center conductor of a 75 ohm coaxial cable.

Tuner 7 heterodynes the RF carriers it receives to produce an IF signal which is applied to IF section 9. The processed IF signal is applied to a signal processing section 11 which controls the generation of an image by a picture tube 13 and an audible response by a speaker 15.

The receiver also includes a UHF section including a UHF balun 17 for transforming the balanced impedance configuration of a UHF antenna network 19 to an unbalanced impedance configuration, and a UHF tuner 21 for heterodyning the received UHF carriers to produce an IF signal which is also applied to IF section 9. The UHF section need not include a fixed-frequency input filter because the undesired FM and CB signals have frequencies too far away from the desired UHF carriers to produce appreciable interference.

Figure 1A:
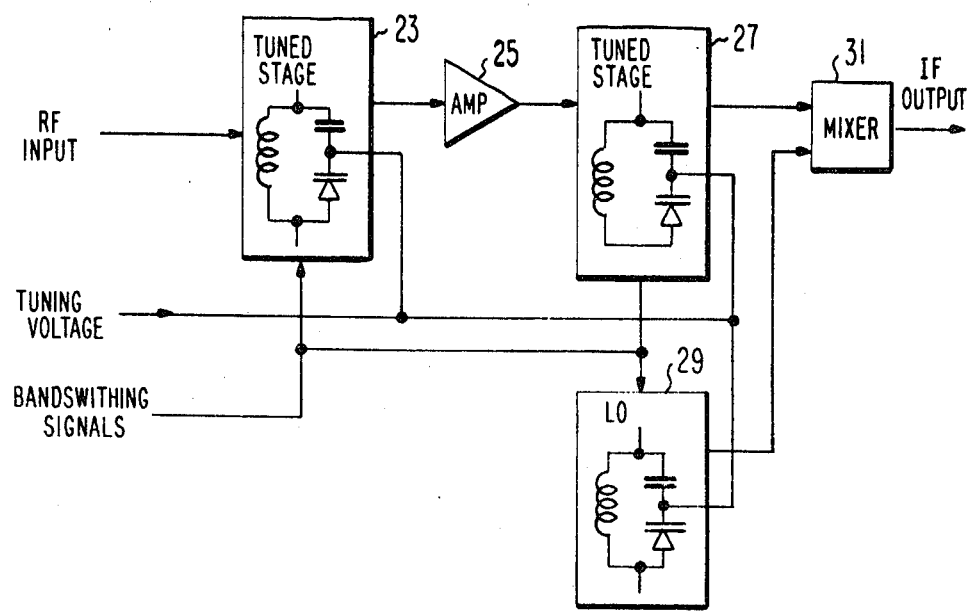

Tuners 7 and 21 essentially include the same functional elements shown in FIG. 1A. Specifically, each of tuners 7 and 21 include a tuned input circuit 23, an RF amplifier 25 and a tuned output circuit 27 coupled successively in cascade to filter and amplify the respective received RF carriers. Each of tuned circuits 23 and 27 include at least one parallel-tuned circuit comprising the parallel combination of an inductor and the series combination of a capacitor and a varactor diode. The capacitance of the varactor diode is adjusted in accordance with the magnitude of a tuning voltage so that the tuned circuit is tuned to select the RF carrier associated with a selected channel. Each of tuners 7 and 21 also includes a local oscillator 29 including a parallel-tuned circuit similar to those in tuned circuits 23 and 27 for determining its frequency of oscillation. The tuned circuit of local oscillator 29 is also controlled in response to the magnitude of the tuning voltage according to the selected channel to determine the frequency to which local oscillator 29 is tuned. A mixer 31 heterodynes the selected RF carrier and local oscillator signal to generate an IF signal modulated in accordance with the selected RF carrier.

Tuners 7 and 21 are selectively enabled to operate in response to respective levels of a V/U bandswitching signal. Since tuner 7 must tune over both a low and high VHF band, the tuned circuits included in it comprise switching diodes (not shown) for selectively switching in different combinations of inductors (not shown) in response to respective LV and HV band selection signals, U.S. patent application Ser. No. 119,991 entitled "Controlled Local Oscillator with Apparatus for Extending its Frequency Range", filed in the name of George William Carter on Feb. 8, 1980, and assigned, like the present application, to RCA Corporation, hereby incorporated by reference, may be referred to for its disclosure of parallel tuned circuits including varactor diodes and diode switching arrangements for selecting different combinations of inductors.

Referring back to FIG. 1, a tuner control unit 33 is responsive to binary signals representing the selected channel stored in a channel selection register 35, to generate the tuning voltage and the various band selection signals. U.S. Pat. No. 4,031,549 entitled "Television Tuning System with Provisions for Receiving RF Carriers at Nonstandard Frequencies", issued in the name of Robert Morgan Rast et al. on June 21, 1977, and assigned, like the present invention, to RCA Corporation, hereby incorporated by reference, may be referred to for its disclosure of a phase locked loop tuning control system for generating a tuning voltage and band selection signals.

Figure 2:
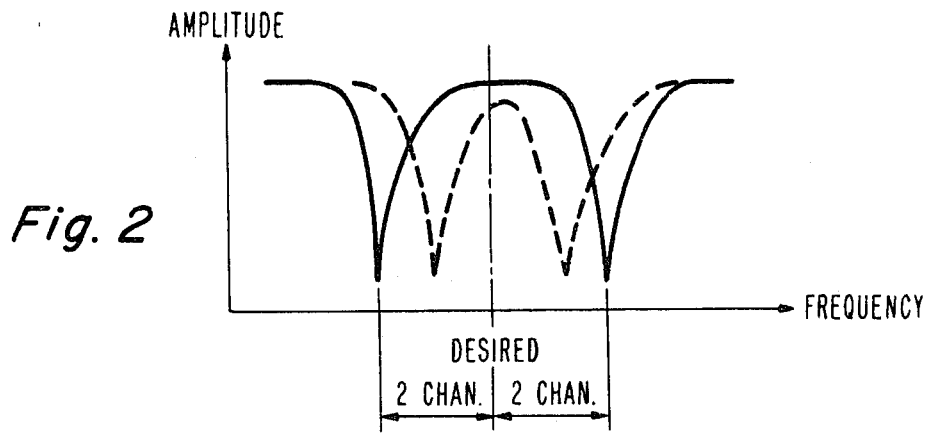
FIGS. 2, 4 and 6 are graphic representations of frequency domain waveforms useful in the understanding of the operation of the embodiments of FIGS. 1, 3 and 5.

Two tunable traps 37a and 37b, each responsive to the tuning voltage, are connected to conductor 9 at points 39a and 39b, respectivley, between the VHF RF input of the receiver, comprising VHF balun 3 and VHF tuner 7. Traps 37a and 37b attenuate undesired signals at predetermined negative and positive frequency offsets, in tracking relationship, from respective desired or tuned RF carriers. As is indicated in FIG. 2, desirably the traps attenuate undesired signals at substantially equal frequencies from respective desired carriers. The symmetrical relationship of trap frequencies to respective desired frequency produces peak amplitude points of the combined response of the two traps at the desired frequencies. This is beneficial in comparison to a single trap since, a single trap produces a residual reactance at frequencies other than the attenuation frequencies which may tend to detune the tuning circuits of tuner 7 and therefore cause attenuation of the desired or tuned RF carrier. In addition, it has been found that the selection of the trap frequencies symmetrically in relationship to respective desired frequencies narrows or sharpens the response at the desired frequencies. This sharpening effect becomes more pronounced as the traps get closer to the desired frequency, as indicated in the phantom waveform of FIG. 2. However, as the traps get closer to the desired frequency, there is a slight amplitude attenuation at the frequency.

Since in a given broadcast location, often every other VHF channel is allocated to a broadcaster, it is desirable that the frequency offsets of traps 37a and 37b are selected to be the equivalent of 2 channel spaces from respective desired picture carriers. With this selection, the closest strong RF television carriers to the desired RF television carriers will be attenuated. Since, in the United States, for the most part channels are spaced 6 MHz apart, the trap frequencies of traps 37a and 37b are desirably selected to be 12 MHz below and above, respectively, the respective desired RF carriers.

It is noted that while, for the most part, in the United States the channels are spaced 6 MHz apart, low VHF channels 4 and 5 are spaced 10 MHz apart. As a result, when channel three is selected the trap at the positively offset frequency will not be precisely at two channel spaces, i,e., 16 MHz, from channel three, but only approximately at two channel spaces, i.e., 12 MHz, from channel three. While in this situation the trap at the positively offset frequency is not precisely at the correct frequency to provide the maximum attenuation of the RF carrier associated with channel five, the attenuation provided will be adequate to inhibit interference due to the RF carrier associated with channel 5.

Since traps 37a and 37b are similar in construction, only trap 37a will be described in detail, the description of trap 37b being provided by analogy by reference to similar reference numbers. Trap 37a is a series tuned circuit including a capacitor 41a, a varactor diode 43a, a first inductor 45a and a second inductor 47a, connected in series, in the order named, between circuit point 39a and signal ground. Varactor diode 43a is poled to be reverse biased by the application of a positive tuning voltage to its cathode through a relatively large value (e.g., megohm) isolation resistor 49a. Under these conditions varactor diode 45a exhibits a capacitance determined by the magnitude of the tuning voltage. The series combination of inductors 45a and 47a is a d-c return path connecting the anode of varactor diode 43a to ground. A switching diode 51a is connected between the junction of inductors 45a and 47a and the end of capacitor 53a. The other end of capacitor 53a is connected to ground. Switching diode 51a is poled to be nonconductive in response to the application of a relatively low voltage (e.g., −2 vd-c) to its anode, through the LV/HV bandswitching line and an isolation resistor 55a, when the selected channel is in the low VHF band. Switching diode 51a is conductive in response to the application of a relatively high voltage (e.g., +10 vd-c) to its anode when the selected channel is in the low VHF band. In the low VHF band, when diode 51a is nonconductive, the combined inductances of inductors 45a and 47a and the combined capacitances of capacitor 41a and varactor diode 43a determine the trap frequency of trap 37a. In the high VHF band, when diode 51a is conductive, inductor 47a is effectively bypassed to signal ground by capacitor 47a and, as a result, the inductance of inductor 45a and the combined capacitance of capacitor 41a and varacotor diode 43a determine the trap frequency of trap 37a.

Capacitor 41a and inductors 45a and 47a determine the negative frequency offset of trap 37a and capacitor 41b and inductors 45b and 47b determine the positive frequency offset of trap 37b. Varactor diodes 43a and 43b are desirably selected to have substantially the same characteristics, i.e., have substantially the same capacitance in response to the tuning voltage so that their attentuation frequencies track the desired RF carrier.

A choke 57 is connected between conductor 9 and signal ground to inhibit a d-c voltage from being developed at point 39a which would tend to change the d-c voltage developed across capacitor 41a which, in turn may undesirably change the d-c voltage developed at varactor diode 43a. Choke 57 is selected to exhibit a relatively large inductive reactance compared to the impedance of the series-tuned circuit comprising trap 37a over a frequency including range of the low and high VHF bands and the tracking frequencies of trap 37a.

The impedance between conductor 9 and signal ground should desirably be relatively low, e.g., between 50 and 75 ohms, at the frequency range of traps 37a and 37b. This causes the amplitude-versus-frequency characteristics of traps 37a and 37b to have a relatively narrow attenuation range because the impedances of traps 37a and 37b at frequencies other than the trap frequencies are relatively high compared with the impedance between conductor 9 and signal ground. As a result, traps 37a and 37b do not appreciably attenuate the desired RF carriers.

Desirably, the physical distance between point 39a at which trap 37a is connected to conductor 9 and point 39b at which trap 37b is connected to conductor 9 is small so that the impedance between points 39a and 39b is negligible and therefore does not affect the trap characteristics.

Figure 3:
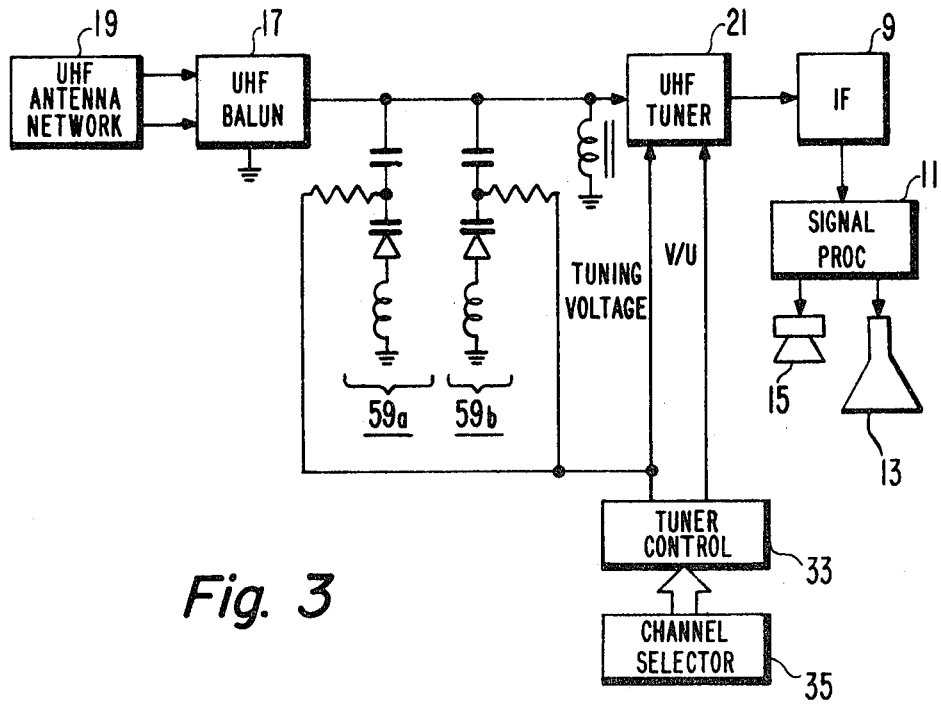

A pair of traps to track the desired or tuned RF frequency at predetermined negative and positive frequency offsets may also be employed to reject undesired signals in the UHF band. Such an arrangement is shown in FIG. 3. In FIG. 3, portions corresponding to similar portions of FIG. 1 are identified by the same reference numbers and will not be described in detail.

Figure 4:
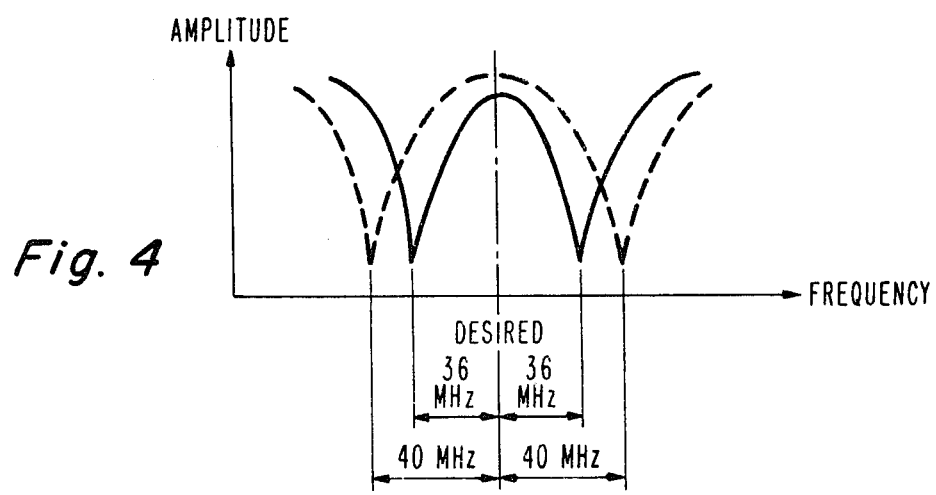

In FIG. 3, traps 59a and 59b track the tuned RF carrier at respective predetermined negative and positive frequency offsets in response to the tuning voltage. Since channels in UHF band, in a given broadcast region, are often allocated so that they are spaced six channels or an equivalent of 36 MHz apart, it is desirable that traps 59a and 59b track the desired RF carrier at frequency offsets of minus and plus 36 MHz, respectively, as is indicated by the solid curve in FIG. 4. However, since signal attenuation at UHF frequencies is less tolerable than at VHF frequencies, it may be more desirable that the center frequencies of traps be slightly further away, e.g., minus and plus 40 MHz, from the desired RF carrier than minus and plus 36 MHz to provide sufficient signal amplitude at the desired frequency as is indicated by the curve shown in phantom in FIG. 4. Frequency offsets of minus and plus 40 MHz have been found to provide a good compromise between nearest allocated channel rejection and desired channel reception.

There may be other desirable selections for the frequency offsets of traps 37a and 37b of the arrangement of FIG. 1 and traps 59a and 59b of the arrangement of FIG. 3. For example, with reference to the VHF broadcast bands, for reception areas between two large cities which often have stations allocated to alternate adjacent channels (i.e., channels 2, 4, 6, 8, etc to city A and channels 3, 5, 7, 9, etc. to city B) it may be desirable to select traps 37a and 37b to attenuate signals at frequency offsets corresponding to minus 1 channel and plus 1 channel, respectively.

Figure 6:
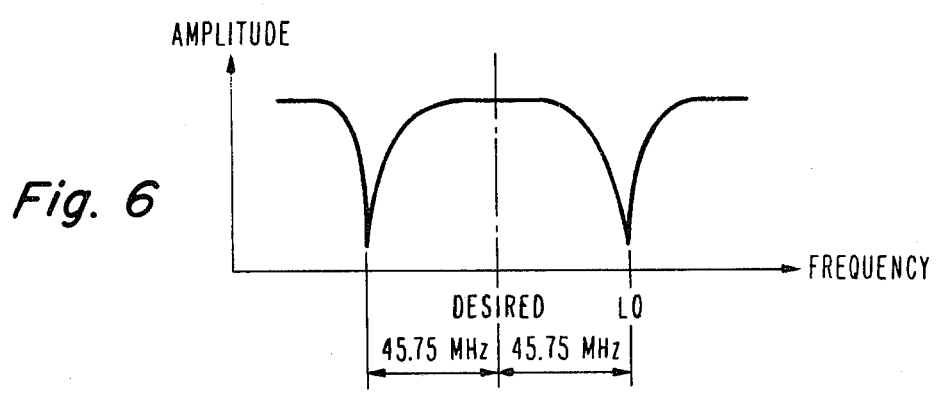

In addition to the rejection of undesired received signals which may interfere with the tuning of desired RF carriers, tunable traps may be located between an RF input and RF tuner to inhibit signals, e.g., such as the local oscillator signal, generated within the RF tuner from reaching the RF input. When such signals generated within the RF tuner reach the RF input, they may be undesirably radiated to other receivers in the vicinity, thereby interfering with their operation. Moreover, when the receiver receives RF carriers from a cable system, if signals such as the local oscillator signal reach the RF input, they may adversely affect the characteristics provided by the cable system. Accordingly, as earlier noted, it is known to place a tunable trap between the RF input of a receiver and the RF tuner to attenuate signals at the frequencies of the local oscillator signal for each channel. For this purpose the trap is set to track the desired carrier at a positive frequency offset substantially equal to the frequency of the IF picture carrier, e.g., 45.75 MHz in the United States. However, such a single trap has an uncompensated residual reactance at off-resonance frequency which may detune portions of the RF tuner. To overcome this deficiency, it is desirable to include another tunable trap between the RF input and RF tuner to track the desired or tuned RF carrier at a negative frequency offset substantially equal to the IF picture carrier frequency, e.g., 45.75 MHz, in the manner graphically illustrated in FIG. 6, to compensate for the residual impedance of the trap having the offset for attenuating the local oscillator signal.

Figure 5:
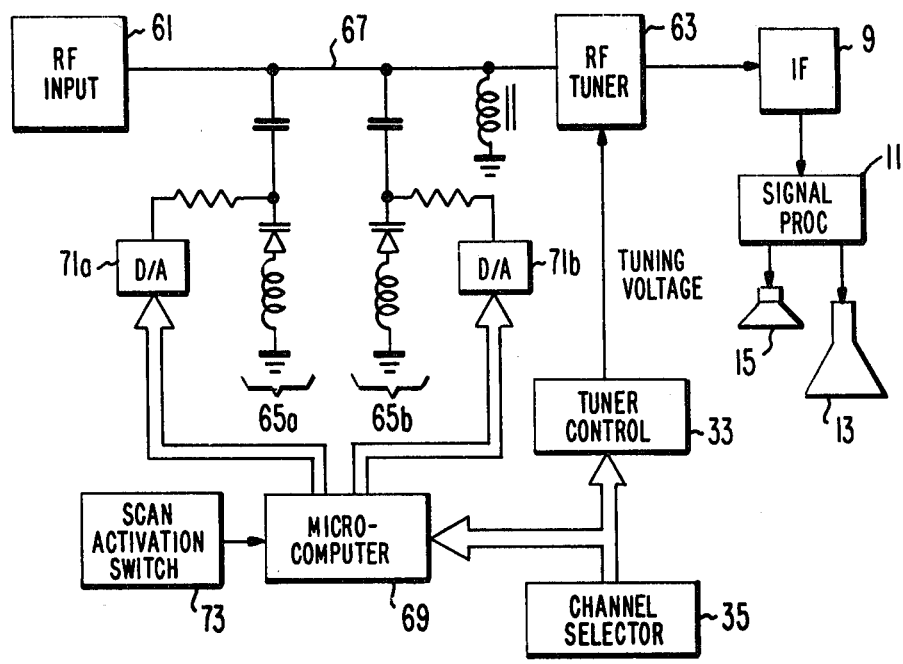

While the arrangements shown in FIGS. 1 and 3, which are the subject matter of the parent application, Ser. No. 154,834, now U.S. Pat. No. 4,361,909, of this division application are acceptable when the trap frequencies are fixed and predictable, since, in general, it is not known in advance by the receiver manufacturer which offsets are best, it is desirable to provide apparatus which permits the adjustment of the frequency offsets of traps prior to the RF tuner relative to respective desired frequencies. FIG. 5 shows such an arrangement which embodies the present invention in that it includes control apparatus for generating a control voltage for voltage variable frequency selective elements, specifically shown as traps, independently of the tuning voltage.

In FIG. 5, units 9, 11, 13, 15, 33 and 35 are similar to corresponding units shown in FIGS. 1 and 3, and therefore are identified by the same reference numbers. RF input 61 and RF tuner 63 are intended to represent corresponding portions of either the VHF or UHF sections of the receiver of FIGS. 1 and 3. Traps 65a and 65b are connected at points along a conductor 67 between RF input 61 and RF tuner 63. A microcomputer 69, operating in accordance with a program stored in its memory (not shown) controls the frequency to which traps 65a and 65b are set by determining the binary signals applied to digital to analog (D/A) converters 71a and 71b which, in turn, generate control voltages for traps 65a and 65b, respectively. Microcomputer 69 is responsive to binary signals representing the selected channel stored in channel selector 35 and the operation of a scan activation switch 73 by a user.

In operation, when a channel is selected by a user, microcomputer 69 responds to the binary signals representing the selected channel number by applying binary signals to D/A converters 71a and 71b corresponding to respective predetermined negative and positive frequency offsets, e.g., ±12 MHz for VHF channels and ±40 MHz for UHF channels, from the respective tuned RF carrier. If the user is satisfied with the resulting image produced by picture tube 13, no further action is taken.

On the other hand, if the user is not satisfied with the image because it contains interference components, he may operate switch 73. In response, microcomputer 69 causes the binary signals applied to D/A converters 71a and 71b to be changed so that the trap frequencies of traps 65a and 65b, respectively, are moved in predetermined increments, e.g., 3 MHz for VHF channels and 6 to 10 MHz for UHF channels, closer to the desired RF carrier. The rate of change is selected to be slow enough, e.g., 5 seconds per increment, to allow the user to stop the search by again operating switch 73 when he is satisfied with the image. If the user does not operate switch 73 to stop the scanning operation, the microcomputer automatically prevents further changes of the trap frequencies at predetermined frequency offsets, e.g., ±3 MHz, the sum of which is at least as large as the bandwidth required for tuning the selected channel.

When the arrangement of FIG. 5 is utilized in the VHF portion, band selection portions (not shown) of traps 65a and 65b may be controlled by tuner control unit 33, as shown in FIG. 1, or may alternately be controlled by microcomputer 69.

Figure 7:
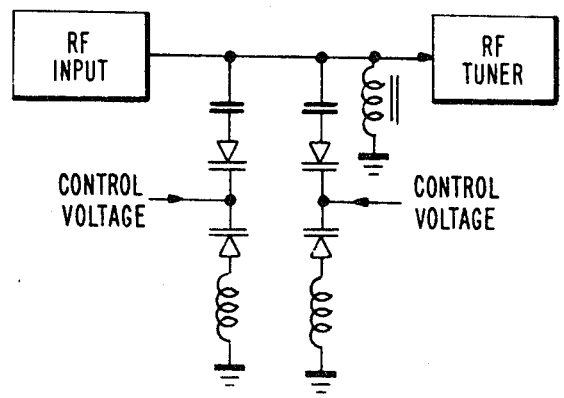

In the various arrangements shown in FIGS. 1, 3, and 5, if RF input signal levels are anticipated to reach a level at which the varactor diodes in the tunable traps begin to rectify, the dc voltage developed across the varactor diode may be modulated by ac voltages developed across the varactor diodes. This tends to cause a corresponding change in the capacitance of the varactor diodes. To inhibit such a capacitance change under strong RF input signal conditions, an additional varactor diode can be placed in series with each varactor diode of each trap in the opposing polarity as indicated in FIG. 7. The capacitance variations of the oppositely poled diode due to ac signal modulations have opposite senses and therefore tend to cancel each other.

While it is most desirable that the negative and positive frequency offsets of the two tunable traps have substantially the same magnitude, the negative and positive frequency offsets may have unequal magnitudes. In this situation, the frequency response around the desired RF carrier will be tilted or skewed, i.e., the amplitude of the response on one side of the desired frequency will be greater than the amplitude on the other side of the desired frequency. This may be used when it is desired to alter the amplitude relationship between various carriers, e.g., the picture and color carriers to compensate for improper frequency responses produced in the antenna network or receiver. Further, while the present invention has been described with reference to embodiments in which the tuned traps are connected to a signal ground point in an unbalanced impedance configuration, they may as well be connected between two conductors balanced in impedance with reference to signal ground. In addition, while scan activation switch 73 of FIG. 5 is shown directly connected to microcomputer 69, it may also be located on a remote control transmitter unit. These and other modifications to the present invention are intended to be within the scope of the invention defined by the following claims.

What is claimed is:

1. In a receiver, apparatus for selecting various channels comprising:
   RF input means for supplying RF signals;
   tuning control means for generating a tuning control voltage in response to the selection of said channels;
   RF frequency selective means for selectively applying RF carriers received from said RF input means having frequencies corresponding to respective channels to a mixer means in response to respective magnitudes of said tuning control voltage;
   local oscillator means for generating a local oscillator signal having frequencies corresponding to respective channels in reponse to respective magnitudes of said tuning control voltage;
   said mixer means being for combining a selected one of said RF carriers and said local oscillator signal to produce an IF signal having at least one information bearing carrier at a predetermined frequency;
   IF processing means for deriving an information signal from said information bearing carrier;
   further control means for generating a further control voltage independently of said tuning control voltage but also in response to the selection of said channels; and
   further frequency selective means coupled to said RF frequency selective means for controlling the frequency response of said RF frequency selective means in response to the magnitude of said further control voltage.

2. The apparatus recited in claim 1, wherein:
   said further frequency selective means is coupled between said RF input means and said RF frequency means and includes at least one signal rejection means for attenuating undesired RF signals received from said RF input means in response to the magnitude of said further control voltage.

3. The apparatus recited in claim 2 wherein:
   for each of said channels which is selected said further control means sets the magnitude of said further control voltage to an initial value corresponding to a predetermined frequency offset from the frequency of the RF corresponding to said selected channel when said channel is initially selected and thereafter adjusts said control voltage to have magnitudes corresponding to successively smaller frequency offsets than said predetermined frequency offset.

* * * * *

UNITED STATES PATENT AND TRADEMARK OFFICE
CERTIFICATE OF CORRECTION

PATENT NO. : 4,399,559

DATED : 8/16/83

INVENTOR(S) : Gerald E. Theriault

It is certified that error appears in the above—identified patent and that said Letters Patent is hereby corrected as shown below:

Column 4, line 29, after "e.g." insert --1--.

Column 8, Claim 2, line 39, after "frequency" insert --selective--.

Signed and Sealed this

Twenty-fifth Day of October 1983

[SEAL]

Attest:

Attesting Officer

GERALD J. MOSSINGHOFF

Commissioner of Patents and Trademarks